United States Patent [19]

Nowak

[11] Patent Number: 5,793,107
[45] Date of Patent: Aug. 11, 1998

[54] POLYSILICON PILLAR HEAT SINKS FOR SEMICONDUCTOR ON INSULATOR CIRCUITS

[75] Inventor: Edward D. Nowak, Pleasanton, Calif.

[73] Assignee: VLSI Technology, Inc., San Jose, Calif.

[21] Appl. No.: 145,268

[22] Filed: Oct. 29, 1993

[51] Int. Cl.[6] ............................................. H01L 23/34
[52] U.S. Cl. .......................... 257/717; 257/713; 257/347
[58] Field of Search ............................. 257/347, 713, 257/717

[56] References Cited

U.S. PATENT DOCUMENTS

| | | | |
|---|---|---|---|
| 4,949,148 | 8/1990 | Bartelink | 257/712 |
| 5,111,260 | 5/1992 | Malhi et al. | 257/347 |
| 5,241,211 | 8/1993 | Tashiro | 257/347 |
| 5,292,670 | 3/1994 | Sundaresan | 257/347 |
| 5,312,782 | 5/1994 | Miyazawa | 257/347 |

OTHER PUBLICATIONS

*AcuThin Wafer Specifications*, Hughes Danbury Optical Systems, Inc. Precision Materials Operations, 100 Wooster Heights Road, Danbury, Connecticut 06810-7589.

Laura Peters, SOI Takes Over Where Silicon Leaves Off, *Semiconductor International*, Mar. 1993, pp. 48-51..

H.H. Hosack, Recent Progress in SOI Materials For the Next Generation of IC Technology.*The Electrochemical Society Interface*, Spring 1993, pp. 51-57.

*Primary Examiner*—David Ostrowski
*Attorney, Agent, or Firm*—Douglas L. Weller

[57] ABSTRACT

A heat sink is formed on a bonded semiconductor on insulator (SOI) wafer. A trench is formed which extends from a top of the bonded SOI wafer through an isolation region of the bonded SOI wafer to a base of the bonded SOI wafer. The base of the bonded SOI wafer is located below the isolation region of the bonded SOI wafer. A conductive pillar is formed in the trench. The conductive pillar extends from the top of the bonded SOI wafer through the isolation region of the bonded SOI wafer and is physically in contact with but electrically insulated from the base of the bonded SOI wafer. In the preferred embodiment, the conductive pillar is formed of doped polysilicon. The doped polysilicon is of a conductivity type which is different than the conductivity type of the base. Out-diffusion from the doped polysilicon forms a region within the base which electrically insulates the conductive pillar from the base.

4 Claims, 6 Drawing Sheets

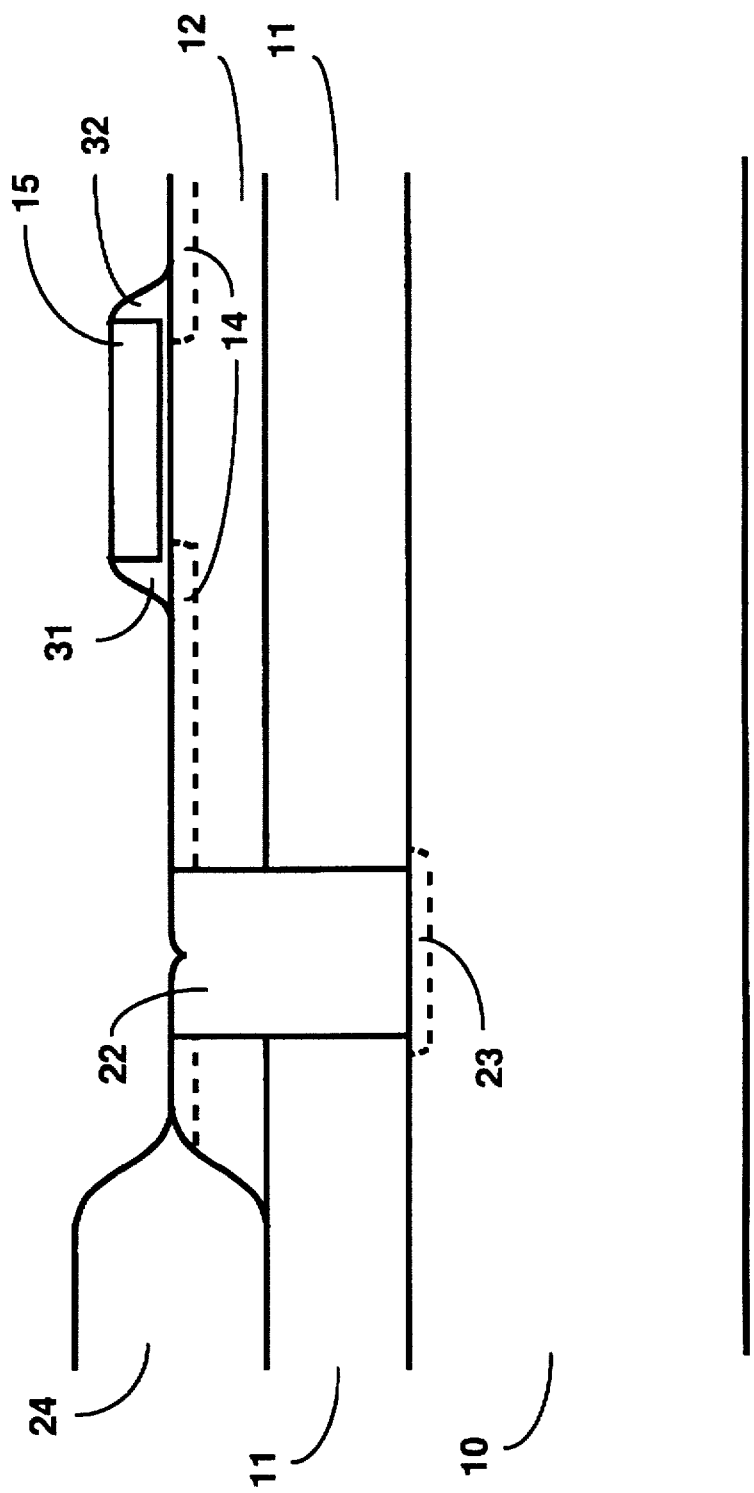

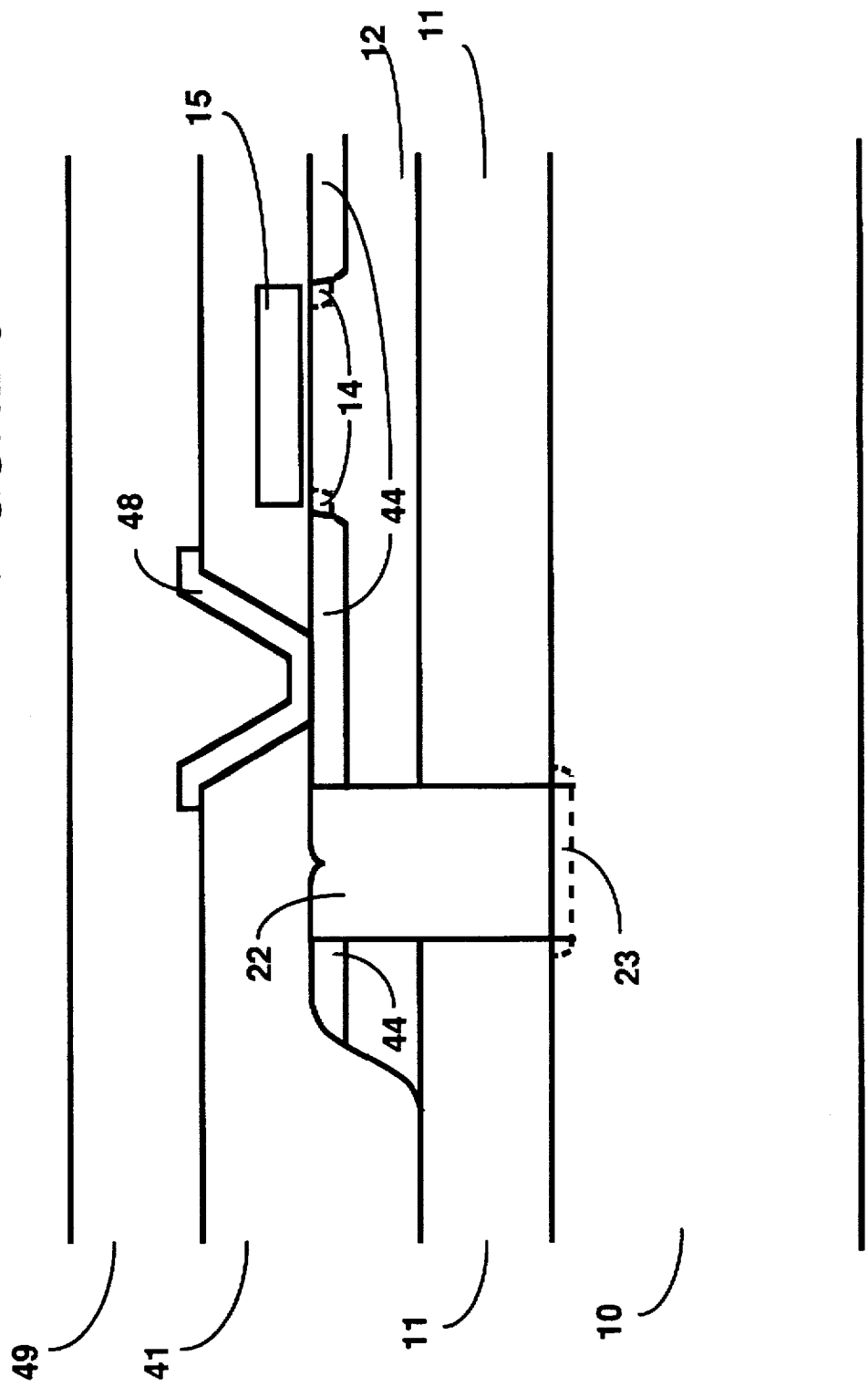

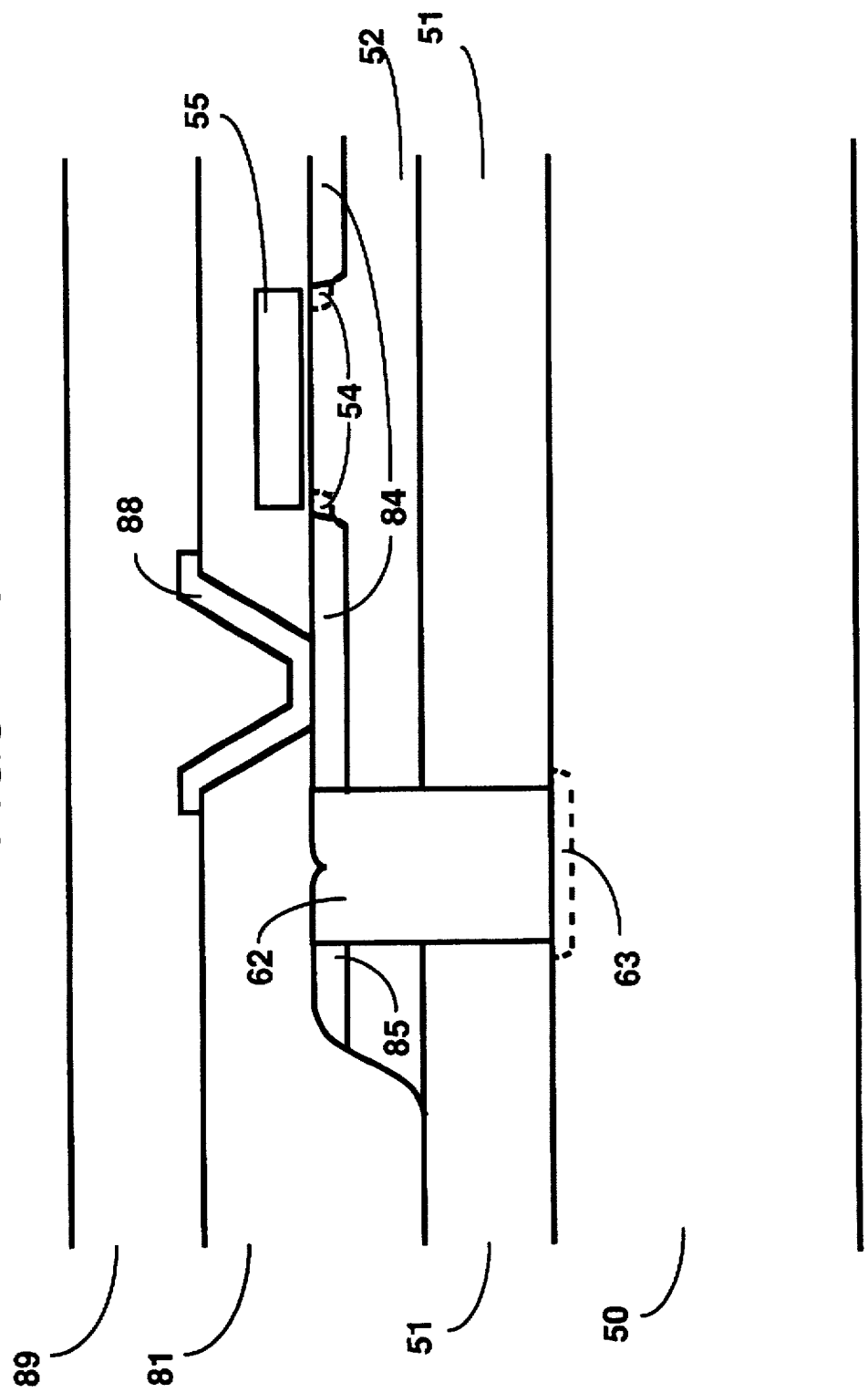

POLYSILICON PILLAR HEAT SINKS FOR SEMICONDUCTOR ON INSULATOR CIRCUITS

BACKGROUND

This invention relates to the creation of heat sinks for semiconductor on insulator (SOI) circuits using polysilicon pillars.

Recent improvements in bonded wafer semiconductor on insulator (SOI) technology makes it feasible to use SOI material in lower cost applications. See, for example, Laura Peters, *SOI Takes Over Where Silicon Leaves Off, Semiconductor International*, March 1993, pp. 48–51; or, H. H. Hosack, *Recent Progress in SOI Materials For the Next Generation of IC Technology, The Electrochemical Society Interface*, Spring 1993, pp. 51–57. Bonded wafers for SOI processes are available, for example, from Hughes Danbury Optical Systems, Inc. Precision Materials Operations, having a business address of 100 Wooster Heights Road, Danbury, Conn. 06810-7589.

SOI material offers performance advantages over bulk complementary metal on silicon (CMOS) technology due to lower parasitic capacitances. However, the isolation feature which improves performance also has disadvantages. The oxide isolation effectively insulates the transistors, reducing the heat dissipation. This can reduce the performance and reliability of high current components such as input/output (I/O) drivers and clock drivers.

SUMMARY OF THE INVENTION

In accordance with the preferred embodiment of the present invention, the formation of a heat sink on a bonded semiconductor on insulator (SOI) wafer is presented. A trench is formed which extends from a top of the bonded SOI wafer through an isolation region of the bonded SOI wafer to a base of the bonded SOI wafer. The base of the bonded SOI wafer is located below the isolation region of the bonded SOI wafer. A conductive pillar is formed in the trench. The conductive pillar extends from the top of the bonded SOI wafer through the isolation region of the bonded SOI wafer and is physically in contact with but electrically insulated from the base of the bonded SOI wafer.

In the preferred embodiment of the present invention, the conductive pillar is formed of doped polysilicon. The doped polysilicon is of a conductivity type which is different than the conductivity type of the base. Out-diffusion from the doped polysilicon forms a region within the base which electrically insulates the conductive pillar from the base.

Use of conductive pillars in accordance with the preferred embodiment of the present invention allows for an improvement in the heat dissipation capabilities of high current devices built on bonded SOI wafers. This results in improved performance and reliability.

BRIEF DESCRIPTION OF THE DRAWINGS

FIG. 1, FIG. 2, FIG. 3, FIG. 4 and FIG. 5 show processing steps to produce a semiconductor on insulator (SOI) device which utilizes a polysilicon heat sink in accordance with the preferred embodiment of the present invention.

FIG. 6 shows a semiconductor on insulator (SOI) device which utilizes a polysilicon heat sink in accordance with another preferred embodiment of the present invention

DESCRIPTION OF THE PREFERRED EMBODIMENT

Figure 1:
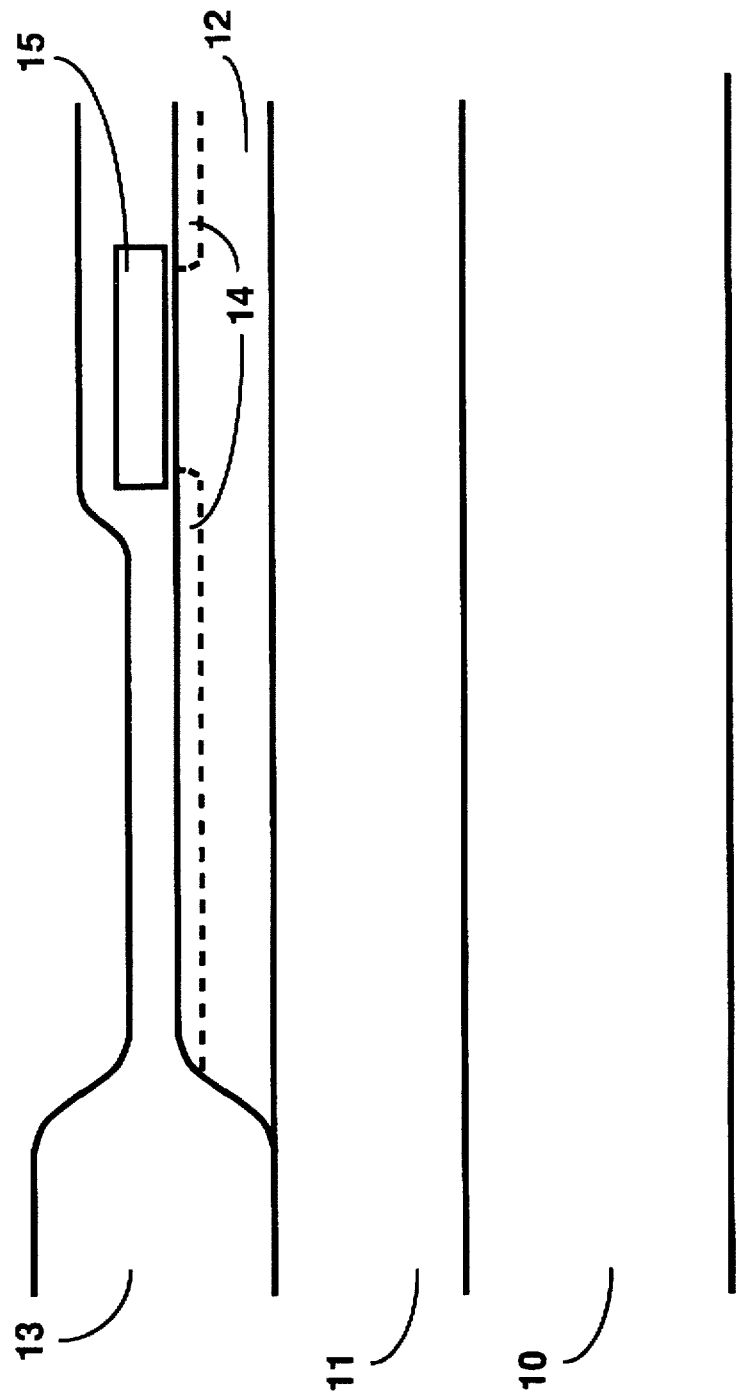

In FIG. 1, a bonded wafer is shown to include a silicon base wafer 10 of a first conductivity type, an isolation oxide region 11 and a silicon layer 12. The silicon base wafer 10 and silicon layer 12 are both of a first conductivity type. For example, the first conductivity type is p-type.

A standard process flow may be used up to the point in the process shown in FIG. 1. For example, a local oxidation of silicon (LOCOS) process or other process is used to form an insulating layer of, for example, field oxide on the wafer. For example, in a LOCOS process, a layer of pad oxide is thermally grown. On top of the pad oxide, a layer of nitride is deposited. The nitride is patterned and etched. Field oxide is grown on the wafer at places where the nitride has been etched to expose silicon layer 12. The nitride and pad oxide are then removed.

After the insulating layer is formed, a layer of gate oxide is placed (i.e. grown or deposited) on exposed portions of silicon layer 12. A gate 15 is formed on the gate oxide layer using a deposited layer followed by a mask and etch process. Gate 15 may be made of polysilicon, for example, doped with n-type atoms at $10^{20}$ atoms per cubic centimeter. The n-type atoms may be, for example, Phosphorus or Arsenic. Alternate to forming gate 15 entirely of polysilicon, a polycide may be used. The polycide gate may be formed as follows. A layer of polysilicon is deposited over the layer of gate oxide. For example, the deposition may be a chemical vapor deposition (CVD). The polysilicon is doped using $POCl_3$. Alternately, an implant of Phosphorus or Arsenic atoms may be used. A metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On the either side of gate 15 are implanted regions 14 of second conductivity type. For example, the second conductivity type is n-type. Regions 14 acts as lightly doped drain (LDD) and source regions for a transistor. For example, regions 14 are n⁻ regions doped with Phosphorus at $10^{18}$ atoms per cubic centimeter. Regions 14 extend 0.1 microns below the surface of silicon layer 12. A spacer oxide region 13 is then deposited to a thickness of, for example, 3000 Angstroms.

Figure 2:
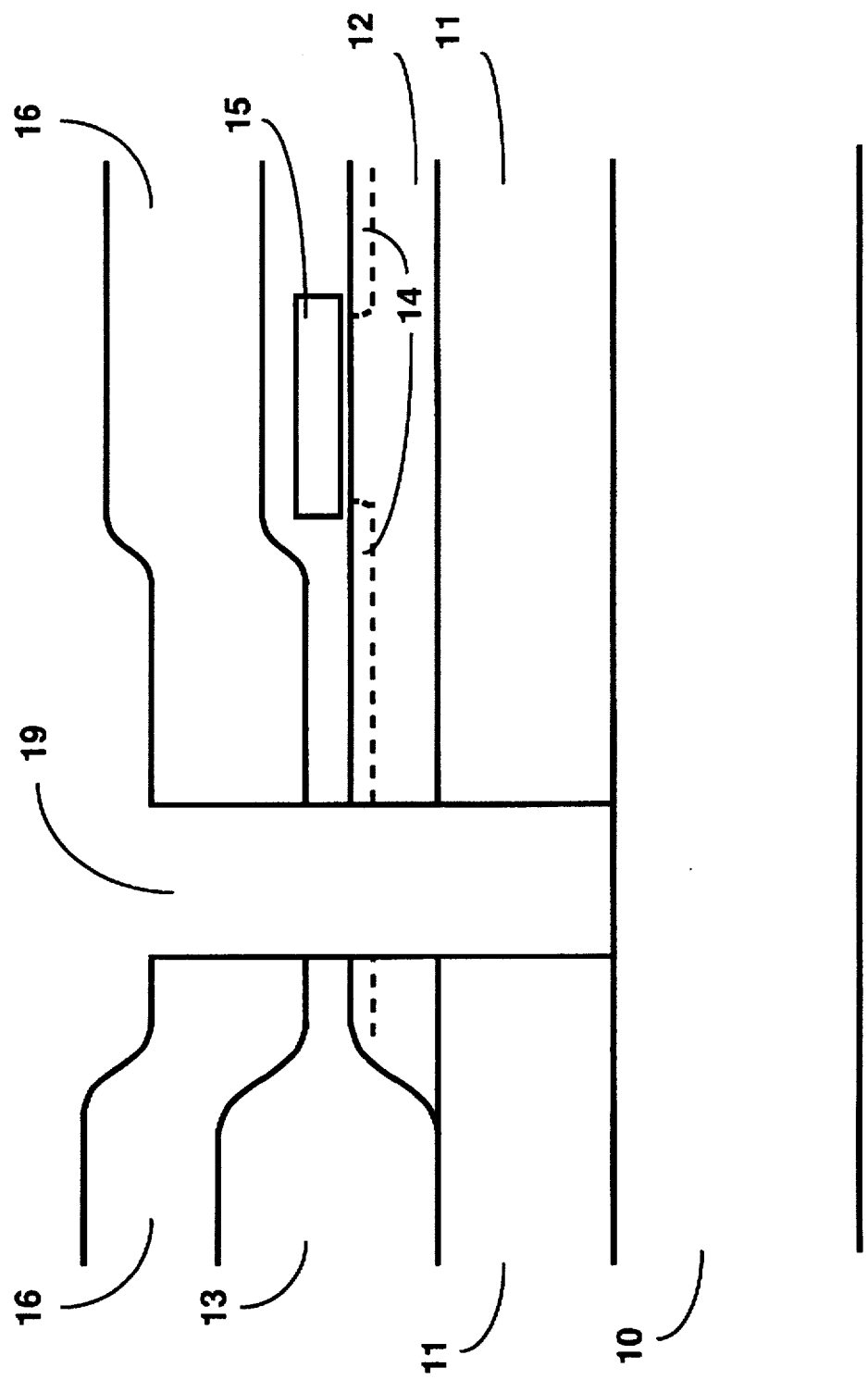

At this point trenches are formed in which polysilicon pillars will be formed. For example, as shown in FIG. 2, a photoresist mask 16 is formed over spacer oxide region 13. A trench 19 is formed by reactive ion etching (RIE) through spacer oxide region 13, silicon layer 12 and isolation oxide 11 to expose silicon base wafer 10.

Figure 3:
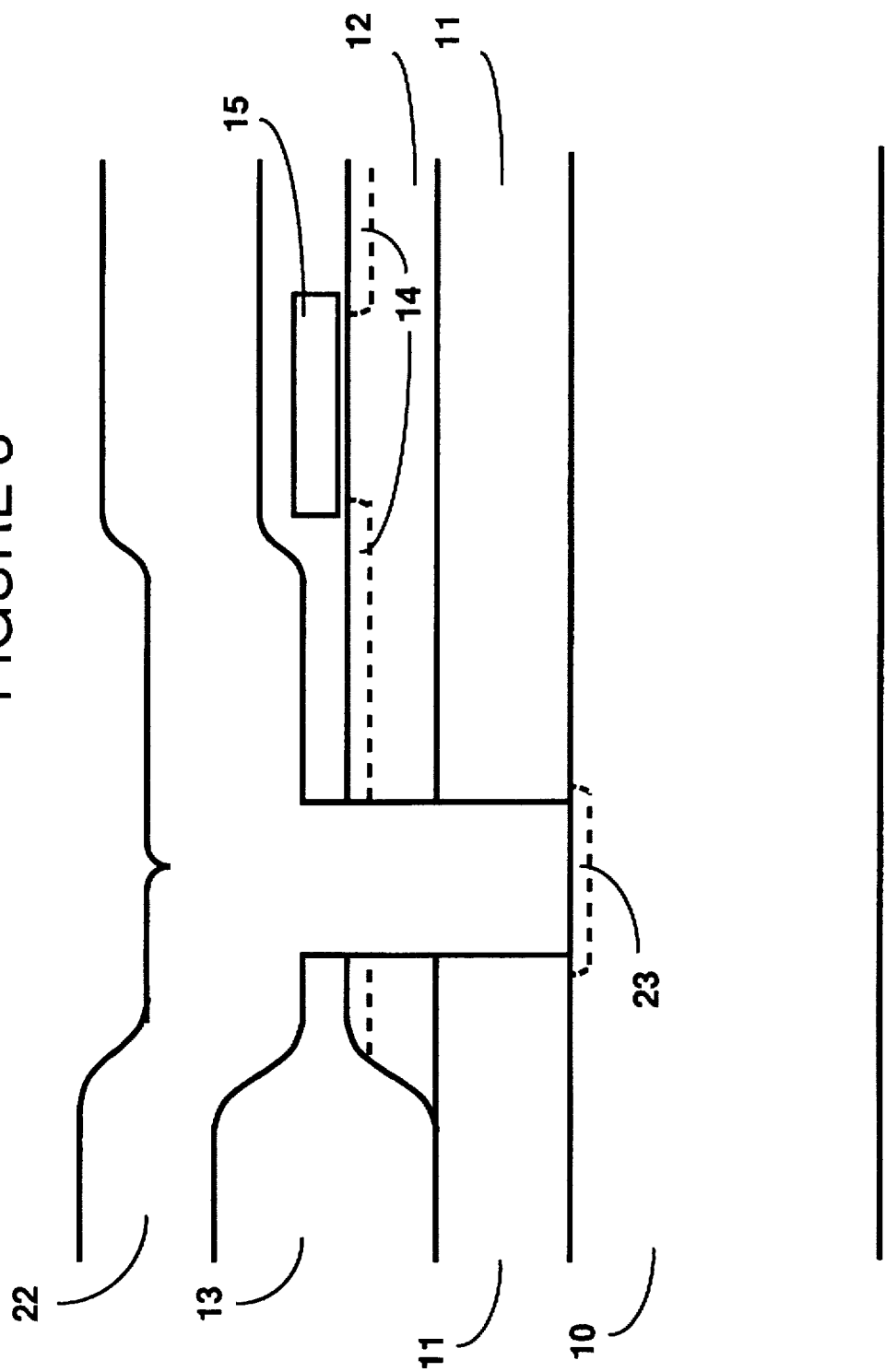

As shown in FIG. 3, a layer 22 of, for example, polysilicon is deposited. Layer 22 will be used to form polysilicon pillars. The thickness of layer 22 should be at least half the minimum width of the trench to assure the trench is completely filled. Layer 22 is doped in-situ during deposition, for example, using Phosphorus at a concentration of $10^{20}$. Out diffusion from layer 22 will result in formation of junction region 23 which serves to electrically isolate the polysilicon pillar from silicon base wafer 10.

Blanket RIE or dry anisotropic etches are used to remove the excess polysilicon layer 22 and the excess portion of spacer oxide 13. The result is shown in FIG. 4. In FIG. 4, a spacer 31 and a spacer 32 are formed on either side of gate 15. Spacer 31 and spacer 32 each extend approximately 0.2 micrometers out from the bottom of gate 15. FIG. 4 additionally shows an isolation region 24 remaining after the blanket etches.

The processing steps for forming the polysilicon pillar heat sink are complete. The remainder of the process steps follow a standard CMOS process flow. For example, source/ drain regions are completed by implanting dopant of first conductivity type, e.g., n-type. The implants may be performed, for example, using n-type atoms to form $n^+$ regions having concentration of $10^{20}$ atoms per cubic centimeter. For example, FIG. 5 shows an $n^+$ regions 44 formed on either side of gate 15. After the additional processing is complete, a layer 41 of, for example, silicon dioxide is placed over the circuit, as shown in FIG. 5. Layer 41 is etched to allow the deposition of a metal layer 48 in connection with source/drain regions 44 and gate regions 15 of the transistor. A final insulating layer 49 is typically placed over metal layer 48, as is understood in the art.

FIGS. 1 through 5 have described use of the present invention in conjunction with the formation of an n-channel metal oxide semiconductor field effect transistor (MOSFET). As will be well understood by those skilled in the art, various embodiments of the present invention can be used in conjunction with other circuitry. For example, FIG. 6 shows use of the present invention used in conjunction with the formation of a p-channel MOSFET.

In FIG. 6, a bonded wafer is shown to include a silicon base wafer 50, a isolation oxide region 51 and a silicon layer 52. In this case, silicon base wafer 50 is of p-conductivity type and silicon layer 52 is of n-conductivity type. As described above, the standard process flow may be used. For example, a local oxidation of silicon (LOCOS) process or other process is used to form an insulating layer of, for example, field oxide on the wafer. After the insulating layer is formed, a layer of gate oxide is placed (i.e. grown or deposited) on exposed portions of the wafer. A gate 55 is formed on the gate oxide layer using a deposited layer followed by a mask and etch process. Gate 55 may be made of polysilicon or polycide. On either side of gate 55 are implanted regions 54. For example, regions 54 are $p^-$ regions doped with Boron at $10^{18}$ atoms per cubic centimeter. Regions 54 extend 0.1 microns below the surface of the substrate. A spacer oxide region is then deposited.

At this point trenches are formed in which polysilicon pillars will be formed. A layer 62 of polysilicon is deposited. Layer 62 will be used to form polysilicon pillars. Layer 62 is doped in-situ during deposition, for example, using Phosphorus at a concentration of $10^{20}$. Out diffusion from layer 62 will result in formation of junction region 63 which serves to electrically isolate the polysilicon pillar from silicon base wafer 50.

Blanket etches are used to remove the excess polysilicon layer 62 and the excess portion of the spacer oxide. Next, $p^+$ diffused or implanted regions 84 form the source/drain regions on either side of gate 55. The implants may be performed, for example, using p-type atoms to form $p^+$ regions having concentration of $10^{20}$ atoms per cubic centimeter. After the additional processing is complete, a layer 81 of, for example, silicon dioxide is placed over the circuit, as shown in FIG. 6. Layer 81 is etched to allow the deposition of a metal layer 88 in connection with source/ drain regions 84 and gate regions 55 of the transistor. A final insulating layer 89 is typically placed over metal layer 88, as is understood in the art.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. In an integrated circuit, a heat sink comprising:

a conductive pillar which extends from a top of a bonded semiconductor on insulator (SOI) wafer through an isolation region of the bonded SOI wafer and is in physical contact with a base of the bonded SOI wafer, the base of the bonded SOI wafer being located below the isolation region of the bonded SOI wafer, wherein the conductive pillar comprises doped polysilicon, doping for the polysilicon out-diffusing from the polysilicon into the base, thereby electrically insulating the conductive pillar from the base.

2. A heat sink as in claim 1 wherein the doped polysilicon is of a conductivity type which is different than the conductivity type of the base.

3. A heat sink formed on a bonded semiconductor on insulator (SOI) wafer, the heat sink comprising:

conductive material in a trench, the trench extending from a top of the bonded SOI wafer through an isolation region of the bonded SOI wafer to a base of the bonded SOI wafer, the base of the bonded SOI wafer being located below the isolation region of the bonded SOI wafer wherein the conductive material extends from the top of the bonded SOI wafer through the isolation region of the bonded SOI wafer and is in physical contact with but is electrically isolated from the base of the bonded SOI wafer, the conductive material comprising doped polysilicon, doping for the polysilicon out-diffusing from the polysilicon into the base, thereby electrically insulating the conductive material from the base.

4. A heat sink as in claim 3 wherein the doped polysilicon is of a conductivity type which is different than the conductivity type of the base.

* * * * *